US012406849B2

(12) United States Patent
Kuratomi et al.

(10) Patent No.: US 12,406,849 B2
(45) Date of Patent: Sep. 2, 2025

(54) METHODS AND APPARATUS FOR ENHANCING SELECTIVITY OF TITANIUM AND TITANIUM SILICIDES DURING CHEMICAL VAPOR DEPOSITION

(71) Applicant: APPLIED MATERIALS, INC., Santa Clara, CA (US)

(72) Inventors: Takashi Kuratomi, San Jose, CA (US); I-Cheng Chen, San Jose, CA (US); Avgerinos V. Gelatos, Scotts Valley, CA (US); Pingyan Lei, San Jose, CA (US); Mei Chang, Saratoga, CA (US); Xianmin Tang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 653 days.

(21) Appl. No.: 17/869,496

(22) Filed: Jul. 20, 2022

(65) Prior Publication Data
US 2022/0359209 A1    Nov. 10, 2022

Related U.S. Application Data

(62) Division of application No. 16/705,119, filed on Dec. 5, 2019, now Pat. No. 11,430,661.
(Continued)

(51) Int. Cl.
*H01L 21/285* (2006.01)
*C23C 16/42* (2006.01)
(Continued)

(52) U.S. Cl.
CPC ........ *H01L 21/28518* (2013.01); *C23C 16/42* (2013.01); *H01J 37/32091* (2013.01);
(Continued)

(58) Field of Classification Search
CPC ....... C23C 16/045; C23C 16/08; C23C 16/42; H01L 21/28518; H01L 21/67248;
(Continued)

(56) References Cited

U.S. PATENT DOCUMENTS 5,972,790 A    10/1999  Arena et al.
7,337,745 B1   3/2008   Komino et al.
(Continued)

FOREIGN PATENT DOCUMENTS

JP    11186197 A  *  7/1999  ........... C23C 16/045
TW    201825699 A    7/2018
WO    WO 2010/095901 A2   8/2010

OTHER PUBLICATIONS

Search Report for Taiwan Invention Patent Application No. 108147315, dated Apr. 21, 2023.
(Continued)

*Primary Examiner* — Brook Kebede
(74) *Attorney, Agent, or Firm* — Moser Taboada

(57) ABSTRACT

Methods and apparatus for selectively depositing a titanium material layer atop a substrate having a silicon surface and a dielectric surface are disclosed. In embodiments an apparatus is configured for forming a remote plasma reaction between titanium tetrachloride ($TiCl_4$), hydrogen ($H_2$) and argon (Ar) in a region between a lid heater and a showerhead of a process chamber at a first temperature of 200 to 800 degrees C.; and flowing reaction products into the process chamber to selectively form a titanium material layer upon the silicon surface of the substrate.

20 Claims, 4 Drawing Sheets

Related U.S. Application Data

(60) Provisional application No. 62/785,999, filed on Dec. 28, 2018.

(51) Int. Cl.
*H01J 37/32* (2006.01)
*H01L 21/67* (2006.01)

(52) U.S. Cl.
CPC . *H01J 37/3244* (2013.01); *H01J 2237/24585* (2013.01); *H01J 2237/3321* (2013.01); *H01L 21/67248* (2013.01)

(58) Field of Classification Search
CPC ......... H01L 21/76843; H01L 21/76876; H01L 21/76877; H01J 37/32091; H01J 37/3244; H01J 2237/24585; H01J 2237/3321
See application file for complete search history.

(56) References Cited

U.S. PATENT DOCUMENTS

| | | |
|---|---|---|
| 9,478,438 B2 | 10/2016 | Thombare et al. |
| 2001/0000866 A1 | 5/2001 | Sneh et al. |
| 2002/0192396 A1 | 12/2002 | Wang et al. |
| 2003/0031794 A1 | 2/2003 | Tada et al. |
| 2003/0045098 A1 | 3/2003 | Verhaverboke et al. |
| 2003/0232500 A1 | 12/2003 | Agarwal |
| 2003/0236003 A1 | 12/2003 | Koo et al. |
| 2006/0021701 A1 | 2/2006 | Tobe et al. |
| 2006/0127601 A1 | 6/2006 | Murakami et al. |
| 2007/0093071 A1 | 4/2007 | Verhaverbeke et al. |
| 2008/0145797 A1 | 6/2008 | Verbeke et al. |
| 2009/0277587 A1 | 11/2009 | Lubomirsky et al. |
| 2012/0097330 A1 | 4/2012 | Iyengar et al. |
| 2015/0184301 A1* | 7/2015 | Saido ............... C23C 16/52 118/715 |
| 2016/0132229 A1 | 5/2016 | Logananthan |
| 2018/0158686 A1 | 6/2018 | Gelatos et al. |

OTHER PUBLICATIONS

International Search Report for PCT/US2019/067394 dated Apr. 17, 2020.

* cited by examiner

```
                                                                    400
┌──────────────────────────────────────────────────────┐
│ OPTIONALLY, FORMING A FIRST DIRECT PLASMA            │
│ REACTION BETWEEN TITANIUM TETRACHLORIDE              │
│ (TICL₄), HYDROGEN (H₂) AND ARGON (AR) INSIDE         ├── 402
│ A PROCESS CHAMBER BETWEEN A SHOWERHEAD               │
│ AND A SUBSTRATE FOR A DURATION OF 0.1 TO             │
│                  200 SECONDS                         │
└──────────────────────────────────────────────────────┘
                            ↓
```

FORMING A REMOTE PLASMA REACTION BETWEEN TITANIUM TETRACHLORIDE (TICL$_4$), HYDROGEN (H$_2$) AND ARGON (AR) WITHIN A PROCESS CHAMBER BETWEEN A LID HEATER AND A SHOWERHEAD TO FORM A TITANIUM MATERIAL LAYER UPON A SUBSTRATE INSIDE A PROCESSING CHAMBER TO SELECTIVELY DEPOSIT THE TITANIUM MATERIAL LAYER ATOP THE SILICON SURFACE OF THE SUBSTRATE, WHEREIN THE DIELECTRIC SURFACE INHIBITS DEPOSITION OF THE TITANIUM MATERIAL LAYER ATOP THE DIELECTRIC SURFACE, AND WHEREIN THE REMOTE PLASMA REACTION REACTS TITANIUM TETRACHLORIDE (TICL$_4$), HYDROGEN (H$_2$) AND ARGON (AR) AT A FIRST TEMPERATURE OF 200 TO 800 DEGREES CELSIUS ── 404

OPTIONALLY POST-TREATING THE TITANIUM MATERIAL LAYER ATOP THE SUBSTRATE ── 405

FORMING A DIRECT PLASMA REACTION BETWEEN NITROGEN (N$_2$), HYDROGEN (H$_2$) AND ARGON (AR) INSIDE PROCESS CHAMBER BETWEEN THE SHOWERHEAD AND THE SUBSTRATE TO FORM A TITANIUM NITRIDE LAYER UPON THE TITANIUM MATERIAL LAYER ATOP THE SILICON SURFACE OF THE SUBSTRATE ── 406

FIG. 4

METHODS AND APPARATUS FOR ENHANCING SELECTIVITY OF TITANIUM AND TITANIUM SILICIDES DURING CHEMICAL VAPOR DEPOSITION

CROSS-REFERENCE TO RELATED APPLICATIONS

This application is a divisional of co-pending U.S. patent application Ser. No. 16/705,119, filed Dec. 5, 2019, which claims benefit of United States provisional patent application Ser. No. 62/785,999, filed Dec. 28, 2018, which is herein incorporated by reference.

FIELD

Embodiments of the present disclosure generally relate to substrate processing equipment and techniques, and more particularly, to methods and apparatus for selectively depositing materials via chemical vapor deposition.

BACKGROUND

Selective deposition processes can advantageously reduce the number of steps and cost involved in conventional lithography while keeping up with the pace of device dimension shrinkage. Selective deposition in a titanium and/or titanium silicide dielectric pattern is of high potential value as titanium and titanium silicide (TiSix) is an important material widely used to form ohmic contacts and reduce contact resistance of transistors connections. The inventors have observed poor selectivity of titanium materials between silicon and dielectrics such as silicon nitride and silicon oxide raise a severe challenge in maximizing metallic feature fill, e.g., poor selectivity may result in titanium material deposition on the sidewalls and bottom of a high aspect ratio feature and limit the ability to fill the feature with a desired metallic material. Because poor selectivity may promote non-uniformity of the substrate, highly selective deposition of titanium material towards silicon is needed to reduce contact resistance and maximize volume of feature fill material.

Accordingly, the inventors have developed improved methods for selective deposition of titanium materials towards silicon or an exposed silicon, and away from dielectrics such as silicon oxide and silicon nitride.

SUMMARY

Methods and apparatus for selective deposition are provided herein. In some embodiments, a method of selectively depositing a titanium material layer atop a substrate having a silicon surface and a dielectric surface, includes: forming a remote plasma reaction between titanium tetrachloride ($TiCl_4$), hydrogen ($H_2$) and argon (Ar) in a region between a lid heater and a showerhead of a process chamber at a first temperature of 200 to 800 degrees C.; and flowing reaction products into the process chamber to selectively form a titanium material layer upon the silicon surface of the substrate.

In some embodiments, a method of selectively depositing a titanium material layer atop a substrate having a silicon surface and a dielectric surface, includes: forming a remote plasma reaction between titanium tetrachloride ($TiCl_4$), hydrogen ($H_2$) and argon (Ar) within a process chamber between a lid heater and a showerhead to form a titanium material layer upon a substrate inside the process chamber to selectively deposit the titanium material layer atop the silicon surface of the substrate, wherein the dielectric surface inhibits deposition of the titanium material layer atop the dielectric surface, and wherein the remote plasma reaction reacts titanium tetrachloride ($TiCl_4$), hydrogen ($H_2$) and argon (Ar) at a first temperature of 200 to 800 degrees C.

In some embodiments, a method of depositing a titanium material layer atop a substrate having a silicon surface and a dielectric surface, includes: optionally, forming a first direct plasma reaction between titanium tetrachloride ($TiCl_4$), hydrogen ($H_2$) and argon (Ar) inside a process chamber between a showerhead and a substrate for a duration of 0.1 to 200 seconds; forming a remote plasma reaction between titanium tetrachloride ($TiCl_4$), hydrogen ($H_2$) and argon (Ar) within a process chamber between a lid heater and a showerhead to form a titanium material layer upon a substrate inside a processing chamber to selectively deposit the titanium material layer atop the silicon surface of the substrate, wherein the dielectric surface inhibits deposition of the titanium material layer atop the dielectric surface, and wherein the remote plasma reaction reacts titanium tetrachloride ($TiCl_4$), hydrogen ($H_2$) and argon (Ar) at a first temperature of 200 to 800 degrees C. to pass titanium material through the showerhead; and forming a direct plasma reaction between nitrogen ($N_2$), hydrogen ($H_2$) and argon (Ar) inside a process chamber between the showerhead and the substrate to form a capping titanium nitride layer for the titanium material layer atop the silicon surface of the substrate.

In some embodiments, the present disclosure relates to a processing chamber, comprising: a lid heater; a showerhead, and a substrate support positioned within the processing chamber, wherein the processing chamber is configured to remotely ignite a plasma in a region between the lid heater and the showerhead and directly ignite a plasma between the showerhead and the substrate support.

In some embodiments, the present disclosure relates to a processing chamber including a lid heater, a showerhead, and a substrate support positioned within the processing chamber, wherein the processing chamber is configured to remotely ignite a plasma inside a process chamber between a lid heater and a showerhead and directly ignite a plasma between the showerhead and the substrate support.

In some embodiments, the present disclosure relates to a non-transitory computer readable medium having instructions stored thereon that, when executed, cause a method of selectively depositing a titanium material layer atop a substrate having a silicon surface and a dielectric surface, including: forming a remote plasma reaction between titanium tetrachloride ($TiCl_4$), hydrogen ($H_2$) and argon (Ar) in a region between a lid heater and a showerhead of a process chamber at a first temperature of 200 to 800 degrees C.; and flowing reaction products into the process chamber to selectively form a titanium material layer upon the silicon surface of the substrate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered

FIG. 4 is a flow diagram of a method of selective deposition in accordance with some embodiments of the present disclosure.

Figure 1:
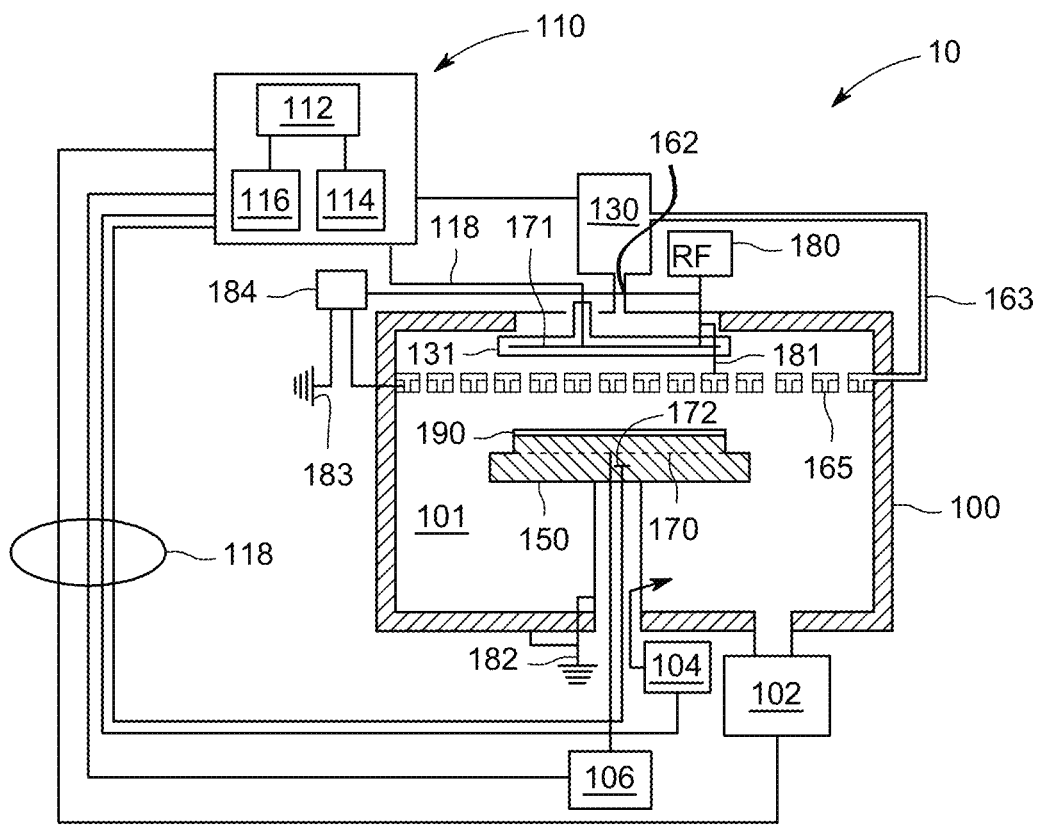
FIG. 1 is a schematic illustration of an apparatus suitable for practicing the methods of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods and apparatus for selective deposition are provided herein. In some embodiments, a method of selectively depositing a titanium material layer atop a substrate having a silicon surface and a dielectric surface, includes: forming a remote plasma reaction between titanium tetrachloride ($TiCl_4$), hydrogen ($H_2$) and argon (Ar) in a region between a lid heater and a showerhead of a process chamber at a first temperature of 200 to 800 degrees C.; and flowing reaction products into the process chamber to selectively form a titanium material layer upon the silicon surface of the substrate. In some embodiments, the methods described herein advantageously enhance and promote selectivity of titanium materials towards silicon and decrease selectivity towards dielectrics such as silicon nitride and silicon oxide. The methods facilitate and promote maximizing metallic feature fill, e.g., increasing selectivity towards the bottom of a feature including silicon and reducing titanium material deposition on the sidewalls of a high aspect ratio feature including a dielectric to increase the volume within a feature to be filled with a desired metallic material. Because the high selectivity towards silicon promotes uniformity of the substrate, contact resistance is advantageously reduced and the volume of feature fill material is advantageously maximized. In some embodiments, the showerhead traps reaction products such as titanium material ions within the showerhead to facilitate selective deposition. In some embodiments, a pretreatment including heating the substrate in the presence of silane further enhances selectivity towards silicon, and away from silicon nitride. In some embodiments, such as where the titanium material is titanium, pretreatment enhances selectivity towards silicon to greater than 40:1. In some embodiments, such as where the titanium material is titanium silicide, pretreatment enhances selectivity towards silicon to greater than 60:1. In some embodiments, a post-deposition treatment including contacting the showerhead and substrate with silane and/or remote plasma hydrogen such as hydrogen radicals may reduce memory effect, where titanium nitride deposits film atop the substrate on both silicon and silicon nitride (SiN) to less than 3 angstroms and further enhances selectivity towards silicon, and away from silicon nitride.

FIG. 1 is a schematic illustration of an apparatus such as wafer processing system 10 suitable for practicing the methods of the present disclosure. In embodiments, the wafer processing system 10 includes a process chamber 100, a gas panel 130, a control unit 110, along with other hardware components such as power supplies and vacuum pumps. Exemplary process chambers may include any of several process chambers configured for remote and direct chemical vapor deposition (CVD) reactions as described herein, available from Applied Materials, Inc. of Santa Clara, California Other suitable process chambers from other manufacturers may similarly be used and modified in accordance with the present disclosure.

In embodiments, the process chamber 100 generally comprises a lid heater 131, which is used to heat processing volume 101 including a region such as a plenum space between lid heater 131 and showerhead 165 within the process chamber 100. Depending on the specific process, processing volume 101 in a region between lid heater 131 and showerhead 165 may be heated to some desired temperature prior to and during processing in accordance with the present disclosure. In embodiments, the lid heater 131 is heated by an embedded heating element such as heating element 171. For example, lid heater 131 may be resistively heated by applying an electric current from an AC supply (not shown) to the heating element 171. The processing volume 101 region between lid heater 131 and showerhead 165 is, in turn, heated by the lid heater 131, and can be maintained within a process temperature range of, for example, 200 to 800 degrees C., or at a first temperature of about 550 degrees C. In some embodiments, the region between a lid heater and a showerhead of a process chamber is maintained at a first temperature of 200 to 800 degrees C. In some embodiments, providing a lid heater at a temperature of 200 to 800 degrees C. or in some embodiments about 550 degrees C., a showerhead at about 500 degrees C. (heated by radiant heat from the lid heater), a wafer temperature of about 425 degrees C., and a pedestal heated to about 450 degrees C. may heat the region between the lid heater and the showerhead to a temperature of 200 to 800 degrees C. or in some embodiments, about 550 degrees C. In embodiments, the region between the lid heater and the showerhead is characterized as a plenum space.

In embodiments, a temperature sensor (not shown), such as a thermocouple, may be embedded in the lid heater 131 to monitor the temperature of the lid heater 131 in a conventional manner. For example, the measured temperature may be used in a feedback loop to control the power supply for the lid heater 131 such that the processing volume 101 temperature of a region between lid heater 131 and showerhead 165 can be maintained or controlled at a desired temperature that is suitable for the particular process application. In embodiments, the lid heater 131 is configured to provide heat sufficient to promote remote plasma formation in processing volume 101 between lid heater 131 and showerhead 165, or within showerhead 165 and prevent condensation within or upon showerhead 165. For example, control unit 110 may be in communication with the lid heater 131 so that a user can adjust the heat of lid heater 131 and maintain a heat sufficient for remote plasma formation. In embodiments, depending upon processing needs, lid heater 131 is configured not to heat, or promote remote plasma formation in processing volume 101 in a region between lid heater 131 and showerhead 165. For example, the lid heater 131 may be switched off by way of control unit 110 depending upon user needs.

In embodiments, a radio frequency electrode 181 may be embedded in the lid heater 131 to configure the lid heater 131 for providing radio frequency in an amount sufficient to form a plasma adjacent the lid heater 131. In embodiments, the lid heater 131 is configured to provide RF sufficient to promote remote plasma formation in processing volume 101 in a region between lid heater 131 and showerhead 165, and/or within showerhead 165. For example, control unit 110 may be in communication with the lid heater 131 so that a user can adjust the RF emitted from lid heater 131 and maintain RF signal sufficient for plasma formation. In embodiments, depending upon processing needs, lid heater 131 is configured not to emit RF signal or promote plasma formation in processing volume 101 between lid heater 131 and showerhead 165. For example, the lid heater 131 may be switched off by way of control unit 110 depending upon user needs eliminating RF generated therefrom.

In embodiments, the process chamber 100 generally includes a support pedestal 150 (e.g., a substrate support), which is used to support a substrate such as a semiconductor substrate 190 within the process chamber 100. The support pedestal 150 can be moved in a vertical direction inside the process chamber 100 using a displacement mechanism (not shown). Depending on the specific process, semiconductor substrate 190 may be heated to some desired temperature prior to processing. In embodiments, the support pedestal 150 is heated by an embedded heating element such as heating element 170. For example, the support pedestal 150 may be resistively heated by applying an electric current from an AC supply 106 to the heating element 170. The semiconductor substrate 190 is, in turn, heated by the support pedestal 150, and can be maintained within a process temperature range of, for example, 200 to 800 degrees C. or 300 to 700 degrees C. In embodiments, a temperature sensor 172, such as a thermocouple, may be embedded in the support pedestal 150 to monitor the temperature of the support pedestal 150 in a conventional manner. For example, the measured temperature may be used in a feedback loop to control the power supply such as AC supply 106 for the heating element 170 such that the semiconductor substrate 190 temperature can be maintained or controlled at a desired temperature that is suitable for the particular process application. In embodiments, the support pedestal includes a ground at 182.

In embodiments, proper control and regulation of gas flows through the process chamber 100 and gas panel 130 is performed by mass flow controllers (not shown) and a controller unit 110 such as a computer. The showerhead 165 allows process gases from the gas panel 130 to be uniformly distributed and introduced into the process chamber 100. In embodiments, showerhead 165 is configured for flowing reaction products (such as reaction products suitable for forming a titanium material layer such as titanium or titanium silicide as described herein) into the process chamber to selectively form a titanium material layer upon the silicon surface of the substrate.

Illustratively, the control unit 110 includes a central processing unit (CPU) 112, support circuitry 114, and memories containing associated control software 116. The control unit 110 is responsible for automated control of the numerous steps required for semiconductor substrate 190 processing such as wafer transport, gas flow control, temperature control, chamber evacuation, and so on. Bi-directional communications between the control unit 110 and the various components of the wafer processing system 10 are handled through numerous signal cables collectively referred to as signal buses 118, some of which are illustrated in FIG. 1.

In some embodiments, the present disclosure relates to a non-transitory computer readable medium, such as memory, having instructions stored thereon that, when executed, cause a method of selectively depositing a titanium material layer atop a substrate having a silicon surface and a dielectric surface, including: forming a remote plasma reaction between titanium tetrachloride ($TiCl_4$), hydrogen ($H_2$) and argon (Ar) in a region between a lid heater and a showerhead of a process chamber at a first temperature of 200 to 800 degrees C.; and flowing reaction products into the process chamber to selectively form a titanium material layer upon the silicon surface of the substrate.

In some embodiments, a radio frequency electrode 181 may be embedded in the showerhead 165 to configure the showerhead 165 for providing RF energy in an amount sufficient to form a plasma adjacent the showerhead 165. In embodiments, the showerhead 165 is configured to provide RF sufficient to promote plasma formation in processing volume 101. For example, control unit 110 may be in communication with the showerhead 165 so that a user can adjust RF emitted from showerhead 165 and maintain RF signal sufficient for plasma formation. In embodiments, the showerhead 165 may optionally be grounded by ground 183 depending upon user needs for plasma placement within processing volume 101. In embodiments, wherein showerhead 165 is grounded, a remote plasma may form in a region between lid heater 131 and showerhead 165 in processing volume 101. In embodiments, wherein showerhead is not grounded, a direct plasma is formed in a region between the showerhead 165 and semiconductor substrate 190 in processing volume 101. A switch 184 may be in communication with the ground 183 and RF electrode 180 and showerhead and configured to control remote and direct plasma formation in accordance with the present disclosure and depending upon user needs. In embodiments the switch 184 and showerhead 165 are in communication and configured to control remote and direct plasma formation in accordance with the present disclosure and depending upon user needs. In some embodiments, a power supply such as an RF or VHF power supply, is electrically coupled to the chamber lid via a switch 184 when the switch is disposed in a first position. When the switch is disposed in a second position (not shown) the power supply is electrically coupled to the showerhead 165. When the switch 184 is in the first position, the power supply is used to ignite and maintain a first plasma which is remote from the substrate, such as a remote plasma disposed in the plenum space or region directly between the lid heater and showerhead. In some embodiments, a remote plasma is composed of the processing gases flowed into the plenum and maintained as a plasma by capacitive coupling of power from the power supply. In some embodiments, when the switch 184 is in a second position, the power supply is used to ignite and maintain a second plasma (not shown) in the processing volume 101 between the showerhead 165 and the substrate 190 disposed on the substrate support.

In embodiments, process chamber 100 includes a vacuum pump 102 to evacuate the process chamber 100 and to maintain the proper gas flows and pressure inside the process chamber 100. A showerhead 165, through which process gases are introduced into the process chamber 100, is located above the support pedestal 150. In embodiments, showerhead 165 may be configured as a multiple gas showerhead having two or more separate pathways, which allow two or more gases to be separately introduced into the processing chamber 100 without premixing. In some embodiments, showerhead 165 is connected to a gas panel 130 which controls and supplies, through mass flow controllers (not shown), various gases used in different steps of the process sequence. During wafer processing, a purge gas supply 104 also provides a purge gas, for example, an inert gas, around the bottom of the support pedestal 150 to minimize undesirable deposits from forming on the support pedestal 150.

In embodiments, control unit 110 is responsible for controlling gas flow from gas panel 130 to the processing volume 101 such as a region between lid heater 131 and showerhead 165 by a first gas flow line 162, or within showerhead 165 by a second gas flow line 163. In some embodiments, process chamber 100 is configured such that gas panel 130 provides titanium tetrachloride ($TiCl_4$), hydrogen ($H_2$) and/or argon (Ar) or a noble gas inside process chamber 100 and processing volume 101. For example, in embodiments, processing volume 101 is configured to receive titanium tetrachloride ($TiCl_4$) at about 1 to 100 sccm or about 25 sccm. In embodiments, processing volume 101 is configured to receive hydrogen ($H_2$) at about 50 to 10000 sccm, or about 500 sccm. In embodiments, processing volume 101 is configured to receive about 3.5 liters of argon. In some embodiments, one or more desired gases may be directed from gas panel 130 into processing volume 101 via a second gas flow line 163. For example, in embodiments, silane such as $SiH_4$, disilane such as $Si_2H_6$, silane compound, or hydrogen ($H_2$), or noble gas such as argon (Ar) gases may be added to processing volume 101 by second gas flow line 163. In some embodiments, such as where processing chamber 100 is configured for remote plasma application, e.g., igniting plasma in a region between lid heater 131 and showerhead 165, or within showerhead 165, one or more desired gases such as titanium tetrachloride ($TiCl_4$), hydrogen ($H_2$) and/or argon (Ar) may be directed from gas panel 130 into processing volume 101 via a first gas flow line 162, and one or more desired gases such as silane such as $SiH_4$, or hydrogen ($H_2$), or argon (Ar) gases may be directed to processing volume 101 by second gas flow line 163. In some embodiments, the inclusion of silane during deposition of titanium material results in the formation of titanium silicide or TiSix. In some embodiments TiSix refers to titanium silicide, wherein x is a number between 0.4 and 2.2. In some embodiments, TiSix refers to one or more of $Ti_5Si_3$, $TiSi_2$, TiSi, or combinations thereof.

In embodiments, the flow rate, temperature, and pressure of the processing volume can be adjusted to a value sufficient for a reaction desired in accordance with the present disclosure. In some embodiments, such as where processing chamber 100 is configured for direct plasma application, e.g., igniting plasma in a region between showerhead 165 and semiconductor substrate 190, one or more desired gases such as nitrogen ($N_2$), hydrogen ($H_2$) and argon (Ar) may be directed from gas panel 130 into processing volume 101 via a first gas flow line 162, and one or more desired gases such as argon (Ar) may be directed to processing volume 101 by second gas flow line 163. In embodiments, the flow rate, temperature, and pressure of the processing volume can be adjusted to a value sufficient for a reaction desired in accordance with the present disclosure.

In embodiments, processing chamber 100 includes an RF electrode 180 sufficient for igniting plasma within the process volume 101 in accordance with the present disclosure. In embodiments, the RF electrode 180 may be coupled to one or more power sources (one power source not shown) through one or more respective matching networks (matching network shown). The one or more power sources may be capable of producing up to 3000 watts of RF energy at a frequency of about 350 kHz to about 60 MHz, such as at about 350 kHz, or about 13.56 MHz, or about 60 Mhz. In embodiments, about 65 watts to 150 watts of RF energy is applied to the remote plasma reaction within process volume 101. In some embodiments, RF energy is about 120 watts to 140 watts or 130 about watts. In some embodiments, pulsed RF energy or RF in a continuous wave mode is applied. In some embodiments, the RF power is about 130 watts, with a pulsed frequency of about 1 kHz, and a duty cycle about 50%. In some embodiments, processing chamber 100 may utilize capacitively coupled RF energy for plasma processing. For example, the process chamber 100 may have a ceiling made from dielectric materials and a showerhead 165 that is at least partially conductive to provide an RF electrode (or a separate RF electrode may be provided). The showerhead 165 (or other RF electrode) may be coupled to one or more RF power sources (one RF power source not shown) through one or more respective matching networks (matching network not shown). The one or more plasma sources may be capable of producing up to about 3,000 watts, or in some embodiments, up to about 5,000 watts, of RF energy.

Figure 2:
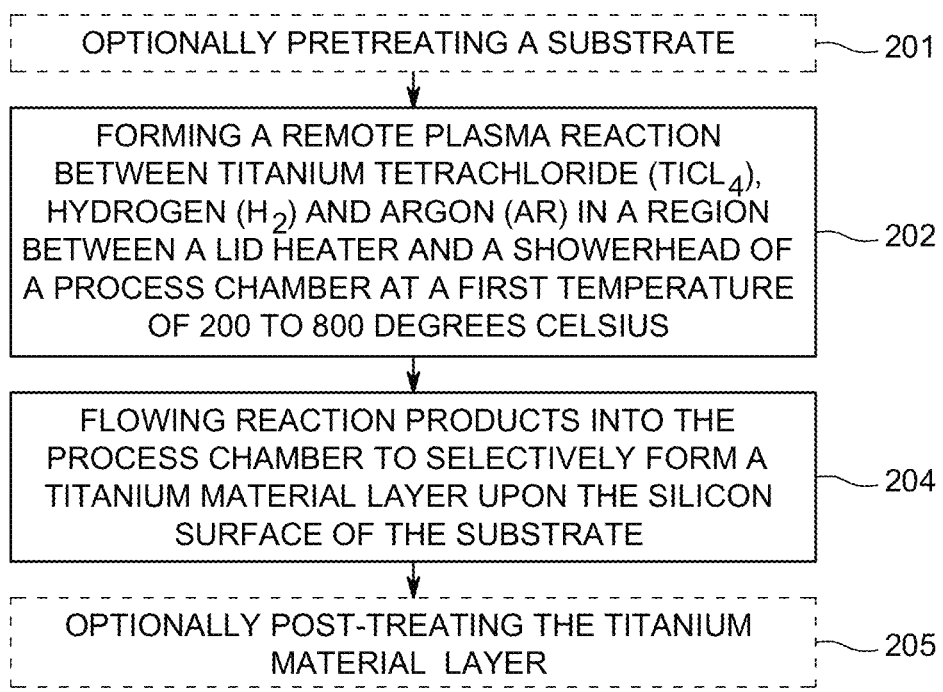
FIG. 2 is a flowchart of a method of selective deposition in accordance with some embodiments of the present disclosure.
Figure 3A:
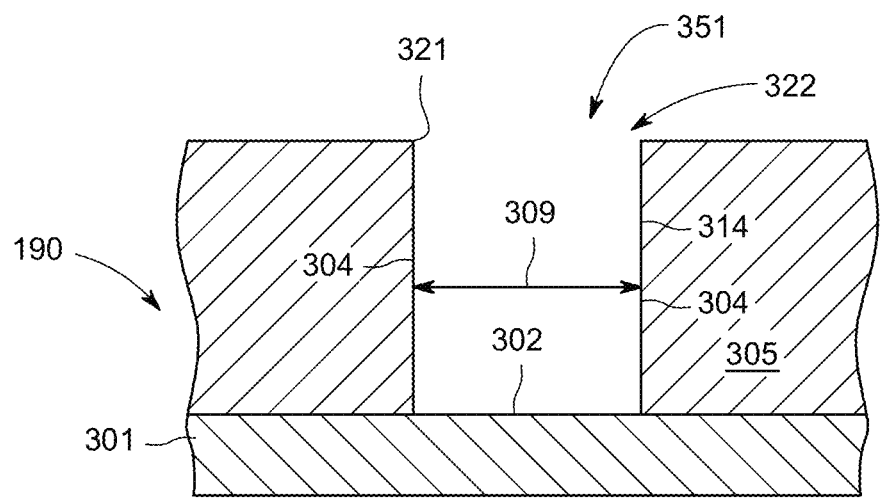
FIGS. 3A-3B are illustrative cross-sectional views of the substrate during different stages of the processing sequence of FIG. 2 in accordance with some embodiments of the present disclosure.
Figure 3B:
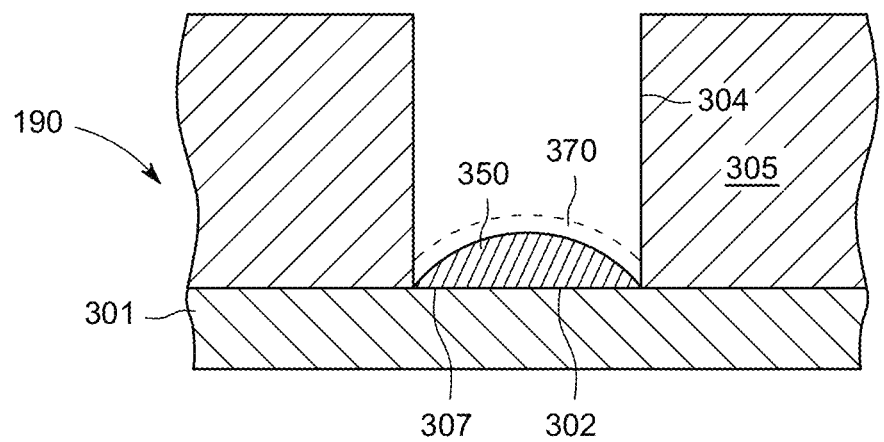

FIG. 2 is a flowchart of a method 200 of selective deposition in accordance with some embodiments of the present disclosure. FIGS. 3A-3B are illustrative cross-sectional views of the substrate such as semiconductor substrate 190 during different stages of the processing sequence of FIG. 2 in accordance with some embodiments of the present disclosure. The methods of the present disclosure may be performed in process chambers configured for thermal deposition techniques such as chemical vapor deposition (CVD), or the process chamber discussed above with respect to FIG. 1.

In embodiments, the method 200 is performed on a semiconductor substrate 190, as depicted in FIG. 3A, having a silicon surface 302 extending across the bottom of feature 351 and one or more dielectric surfaces such as dielectric surface 304. In embodiments, semiconductor substrate 190 may comprise a silicon material 301 such as crystalline silicon (e.g., Si<100> or Si<111>), silicon germanium, doped or undoped polysilicon, doped or undoped silicon wafers, patterned or non-patterned wafers, silicon on insulator (SOI), and combinations thereof. In embodiments, semiconductor a silicon material 301 may comprise or consist of a material such as crystalline silicon (e.g., Si<100> or Si<111>), pure silicon, substantially pure silicon (having less than 1%, or less than 0.5% impurities), or exposed silicon, such as a pretreated silicon with a native oxide layer removed. In embodiments, the semiconductor substrate 190 may have various dimensions, such as 200 mm, 300 mm, 450 mm or other diameters for round substrates. The semiconductor substrate 190 may also be any polygonal, square, rectangular, curved or otherwise non-circular workpiece, such as a polygonal glass substrate used in the fabrication of flat panel displays. Unless otherwise noted, implementations and examples described herein are conducted on substrates such as semiconductor substrate 190 with, for example, a 200 mm diameter, a 300 mm diameter, or a 450 mm diameter substrate.

In some embodiments, silicon material 301 is deposited via any suitable atomic layer deposition process or a chemical layer deposition process. In some embodiments, the silicon material 301 may comprise any suitable silicon material for semiconductor device fabrication. Referring to FIG. 3A, a silicon oxide layer (not shown) may be atop silicon surface 302. The silicon oxide layer may be a native oxide layer or form as silicon surface 302 contacts oxygen, for example in air or water. In some embodiments, silicon oxide layer may be problematic in that the silicon oxide layer may be less selective towards titanium materials than an exposed silicon surface. In some embodiments, method 200 may include, pre-treating the silicon surface 302 to form an exposed silicon surface. In some embodiments, methods include contacting the silicon surface 302 with one or more etchants to form an exposed silicon surface 302. In some embodiments, a silicon oxide layer is removed prior to depositing a titanium material atop, or directly atop silicon surface 302 to form an exposed silicon surface. Non-limiting examples of exposed silicon surface material includes substantially pure, for example, substantially free of oxide, silicon and the like.

In embodiments, dielectric layer 305 including dielectric surface 304 is not the same as silicon material 301 including silicon surface 302. In some embodiments, the dielectric layer 305 is deposited via any suitable atomic layer deposition process or a chemical layer deposition process. In some embodiments, the dielectric layer 305 may comprise a low-k dielectric layer deposited atop silicon material 301. In some embodiments, dielectric layer 305 may include any low-k dielectric material suitable for semiconductor device fabrication, and combinations thereof. Non-limiting materials suitable as low-k dielectric material may comprise a silicon containing material, for example, such as silicon oxide (SiO2), silicon nitride, or silicon oxynitride (SiON), or combinations thereof, or combinations of layers thereof. In embodiments, the low-k dielectric material may have a low-k value of less than about 3.9 (for example, about 2.5 to about 3.5). In some embodiments, the dielectric layer 305 may comprise hafnium oxide such as $HfO_x$. In embodiments, dielectric layer 305 and dielectric surface 304 comprise or consist of silicon oxide ($SiO_2$), silicon nitride, silicon oxynitride (SiON), or combinations thereof.

In some embodiments, the substrate is optionally pretreated as shown in process sequence 201 of method 200. In some embodiments, the dielectric layer 305 is pretreated by contacting the dielectric layer 305 with silane alone or in combination with a noble gas such as argon. In some embodiments, dielectric layer 305 comprises a nitrogen material such as silicon nitride, and the substrate may be preheated prior to depositing a titanium material layer. In some embodiments, during a method of selectively depositing a titanium material layer atop a substrate having a silicon surface and a dielectric surface, such as silicon nitride, prior to forming a remote plasma reaction between titanium tetrachloride ($TiCl_4$), hydrogen ($H_2$) and argon (Ar) in a region between a lid heater and a showerhead of a process chamber at a first temperature of 200 to 800 degrees C., the substrate is preheated to a temperature of 200 to 800 degrees C. by contacting the substrate and dielectric surface with heated gas such as heated argon or hydrogen. Referring to FIG. 1, in some embodiments, argon and hydrogen may be flowed via first gas flow line 162 and heated to preheat the substrate. In some embodiments, silane and argon may be flowed through second gas flow line 163 while preheating the substrate. In embodiments, about 500 sccm to 3000 sccm of silane is flowed through second gas flow line 163 to react with and/or cover dielectric surface 304. In some embodiments, the dielectric surface is silicon nitride (SiN) and silane is contacted with the dielectric surface in an amount sufficient to saturate an exposed surface of the dielectric surface 304. In embodiments, silane bonds to the silicon in a silicon nitride layer of dielectric surface 304, further enhancing selectivity of titanium material towards silicon. In some embodiments, a pretreatment including heating the substrate in the presence of silane further enhances selectivity towards silicon, and away from silicon nitride. In some embodiments, such as where the titanium material is titanium, pretreatment enhances selectivity towards silicon to greater than 40:1 such as 45:1. In some embodiments, such as where the titanium material is titanium silicide, pretreatment enhances selectivity towards silicon to greater than 60:1 such as 68:1.

In some embodiments, the method 200 optionally begins at 201 by pretreating a substrate such as by preheating as described above to a temperature above 200 degrees C. or between 200 degrees C. to 800 degrees C. In some embodiments, such as where the dielectric surface is silicon nitride, the substrate may be further contacted with silane during pretreatment as described above.

In some embodiments, the present disclosure relates to a method of selectively depositing a titanium material layer atop a substrate having a silicon surface and a dielectric surface including silicon nitride, including: preheating the substrate by contacting the substrate with hydrogen and argon at a temperature above room temperature (such as a temperature of 200 to 800 degrees C.) while contacting the substrate with argon and silane; subsequently forming a remote plasma reaction between titanium tetrachloride ($TiCl_4$), hydrogen ($H_2$) and argon (Ar) in a region between a lid heater and a showerhead of a process chamber at a first temperature of 200 to 800 degrees C.; and flowing reaction products into the process chamber to selectively form a titanium material layer upon the silicon surface of the substrate. In some embodiments, silane and argon are supplied through second gas flow line 163 to form a titanium material layer comprising or consisting of titanium silicide (TiSix). In embodiments, a silane ($SiH_4$) pre-soak enhances selectivity for remote plasma chemical vapor deposition (CVD) titanium and remote plasma CVD titanium silicide (TiSix) deposition process. In embodiments, pretreated as shown in process sequence 201 includes preheating the substrate by contacting the substrate with hydrogen and argon at a temperature above room temperature (such as a temperature of 200 to 800 degrees C.) while contacting the substrate with argon and silane.

In embodiments, the dielectric layer 305 may include one or more features 351 such as a via or trench formed in the dielectric layer 305. The one or more features 351 may be formed by etching the dielectric layer 305 using any suitable etch process. In some embodiments, the one or more features 351 is defined by one or more sidewalls 314, an opening 322 and upper corners 321. In some embodiments, the one or more features 351 may have a high aspect ratio, e.g., an aspect ratio between about of about 5:1 and about 20:1. As used herein, the aspect ratio is the ratio of a depth of the feature to a width of the feature. In embodiments, the one or more features 351 has a width 309 less than or equal to 20 nanometers, less than or equal to 10 nanometers, or a width 309 between 5 to 10 nanometers.

Still referring to FIG. 2, in some embodiments, method 200 may begin at 202 by forming a remote plasma reaction between titanium tetrachloride ($TiCl_4$), hydrogen ($H_2$) and argon (Ar) in a region between a lid heater and a showerhead of a process chamber at a first temperature of 200 to 800 degrees C. In some embodiments, method 200 continues at 204 by flowing reaction products such as reaction products from the remote plasma reaction, into the process chamber to selectively form a titanium material layer upon the silicon surface of the substrate. In some embodiments, the method includes forming a remote plasma reaction between titanium tetrachloride ($TiCl_4$), hydrogen ($H_2$) and argon (Ar) within a process chamber (such as process chamber 100 in FIG. 1) in a region between a lid heater (such as lid heater 131 in FIG. 1) and a showerhead (such as showerhead 165 shown in FIG. 1) to form reaction products suitable to form a titanium material layer 350 upon a substrate such as semiconductor substrate 190 inside the process chamber to selectively deposit the titanium material layer 350 atop the silicon surface 302 of the substrate. In embodiments, the dielectric surface 304 inhibits deposition of the titanium material layer 350 atop the dielectric surface 304. In embodiments, a remote plasma reaction reacts titanium tetrachloride ($TiCl_4$), hydrogen ($H_2$) and argon (Ar) at a first temperature of 200 to 800 degrees C. In some embodiments, the substrate such as semiconductor substrate 190 comprises a feature such as a high aspect ratio feature, wherein the silicon surface 302 is disposed at a bottom 307 of the high aspect ratio feature and the dielectric surface 304 is disposed on one or more sidewalls 314 of the high aspect ratio feature such as one or more features 351. In some embodiments, a first temperature is about 550 degrees C., or below 500 degrees C. In some embodiments, about 65 watts of RF energy is applied to the remote plasma reaction. In embodiments, the titanium material layer is deposited to a predetermined thickness such as about 10 angstroms to about 100 angstroms, or about 100 to about 500 angstroms. In some embodiments, the titanium material layer 350 comprises titanium, titanium silicide, or substantially pure titanium.

In some embodiment, method 200 further comprises adding silane compound such as silane, hydrogen, and argon to the showerhead (such as showerhead 165 in FIG. 1) to contact a remote plasma reaction. In embodiments the titanium material layer 350 comprises or consists of titanium silicide. In some embodiments, the titanium silicide is characterized as $TiSi_x$, wherein x is a number in the range of 0.4 to 2.2.

Referring to FIG. 2, at process sequence 205, some embodiments of method 200 may optionally include a post-deposition treatment of the titanium material layer to further enhance selectivity and facilitate the robust formation of a semiconductor device. Accordingly, post-treating the titanium material layer is included in the present disclosure. In some embodiments, post-treating the titanium material layer after deposition will include preselected process sequences dependent upon the makeup of the deposited titanium material layer, e.g. whether the titanium material layer is a result of remote plasma chemical vapor (CVD) deposition of titanium or remote plasma CVD deposition of titanium silicide.

The inventors have observed benefits of post-treating the titanium material layer subsequent to deposition thereof. For example, the inventors have observed that residuals or reaction byproducts such as titanium chloride ($TiCl_x$ or $TiCl_x$, wherein x is a number in the range of 1 to 3, or wherein x=3) on the showerhead contributes to the formation of titanium nitride (TiN) and problematically deposits a TiN film atop both the silicon surface or exposed silicon surface and the dielectric surface such as a silicon nitride dielectric surface which degrades selectivity. The inventors have found that post-treatment after remote plasma CVD titanium or remote plasma CVD titanium silicide is deposited and before any downstream nitridation passivates byproducts such as titanium chloride deposited or sticking to the showerhead and reduces a problematic memory effect to below three angstroms.

In some embodiments, a post-deposition treatment is optionally performed subsequent to remote plasma CVD deposition of titanium. The inventors have observed that where a remote plasma reaction reacts titanium tetrachloride ($TiCl_4$), hydrogen ($H_2$) and argon (Ar) provided through first gas flow line 162 and argon (Ar) provided through the second gas flow line 163 at a first temperature of 200 to 800 degrees C., titanium chloride ($TiCl_x$) and hydrogen radicals may collect between the showerhead and the substrate problematically resulting in titanium chloride ($TiCl_x$) sticking to the showerhead surface and/or substrate top surface. Subsequent to the formation of titanium chloride ($TiCl_x$), the titanium chloride ($TiCl_x$) may be contacted with silane provided through second gas flow line 163 which covers the titanium chloride ($TiCl_x$) and forms titanium silicide ($TiSi_x$) on the showerhead at a temperature greater than 400 degrees C., such as 450 to 500 degrees C., or between a temperature of 200 to 800 degrees C. In some embodiments, the showerhead is at a temperature of 200 to 800 degrees C., or about 500 degrees C. heated by radiation energy from the lid heater at a temperature of 200 to 800 degrees C. or about 550 degrees C. In embodiments, 0.5 liters to 3 liters of silane compound such as silane is added. In embodiments, silane compound or silane flows through second gas flow line 163 at 500 to 3000 sccm. In some post-treatment embodiments, subsequent to the formation of titanium silicide ($TiSi_x$), silane compound or silane is purged from the process chamber by performing hydrogen soak and/or remote plasma soak where hydrogen radicals react with the titanium silicide ($TiSi_x$) to form a robust titanium silicide ($TiSi_x$) composition that does not flake off the showerhead and/or onto the substrate. In embodiments, titanium silicide ($TiSi_x$) has excellent adhesion and strong binding compared to titanium chloride ($TiCl_x$). In some embodiments, the remote plasma is performed by flowing hydrogen and argon through the first gas flow line 162 while flowing argon through the second gas flow line 163. In embodiments, the process chamber is grounded such that a remote plasma forms between the lid heater and showerhead. In some embodiments, subsequent to flowing reaction products into the process chamber to selectively form a titanium material layer upon the silicon surface of the substrate: the titanium material layer is post-treated at a temperature greater than 200 degrees C. or to a temperature of 200 to 800 degrees C. In some embodiments, wherein the titanium material layer comprises or consists of titanium the post-treating or post-treatment includes contacting the titanium with silane and one or more of hydrogen or hydrogen radicals.

In some embodiments, a post-deposition treatment is optionally performed subsequent to remote plasma CVD deposition of titanium silicide. The inventors have observed that where a remote plasma reaction reacts titanium tetrachloride ($TiCl_4$), hydrogen ($H_2$) and argon (Ar) provided through first gas flow line 162 and argon (Ar) and silane provided through the second gas flow line 163 at a first temperature of 200 to 800 degrees C., titanium chloride ($TiCl_x$), hydrogen radicals and silane compound such as silane react between the showerhead and the substrate to form titanium silicide ($TiSi_x$) on the showerhead surface and/or substrate top surface. The inclusion of silane compound such as silane in the deposition reactants forms problematic titanium silicide ($TiSi_x$). Subsequent to the formation of titanium silicide ($TiSi_x$), silane is purged from the process chamber by performing hydrogen soak and/or remote plasma soak where hydrogen radicals react with the titanium silicide ($TiSi_x$) to form a robust titanium silicide ($TiSi_x$) composition that does not flake onto the substrate or off the showerhead. In embodiments, titanium silicide (TiSix) has excellent adhesion and strong binding. In some remote plasma CVD deposition of titanium silicide embodiments, a silane soak process sequence is not performed as, in embodiments, the deposition chemistry includes silane. In some embodiments, the remote plasma is performed by flowing hydrogen and argon through the first gas flow line 162 while flowing argon through the second gas flow line 163. In embodiments, the process chamber is grounded such that a remote plasma forms between the heater lid and showerhead. In some embodiments, the titanium material layer to be post-treated comprises or consists of titanium silicide and the post-treating comprises contacting the titanium silicide with one or more of hydrogen or hydrogen radicals such as in an amount sufficient to make the titanium silicide robust.

In some embodiments, method 200 may further include forming a direct plasma reaction between nitrogen ($N_2$), hydrogen ($H_2$) and argon (Ar) inside a process chamber (such as process chamber 100 in FIG. 1) between the showerhead (such as showerhead 165 in FIG. 1) and the substrate to form a titanium nitride capping layer 370 upon or within the titanium material layer 350 atop the silicon surface 302 of the semiconductor substrate 190. In some embodiments, a direct plasma nitrogen and hydrogen reaction is provided to form titanium nitride capping layer 370. In some embodiments, the direct plasma reaction is performed subsequent to post-treating the titanium material layer 350 as described above. In some embodiments nitrogen is included in the direct plasma reaction in an amount of 4 to 8 standard liters per minute (slpm) or about 6 slpm. In some embodiments, hydrogen is provided to the direct plasma reaction in an amount of 0.5 to 2 slpm, or about 1 slpm. In embodiments argon is provided the direct plasma reaction in an amount of 2 to 5 slpm such as 3.75 slpm. In embodiments, the process chamber during the direct plasma reaction has a pressure of about 1 to 8 Torr, such as 4 Torr. In embodiments, RF power is applied during the direct plasma reaction at about 500 watts. In some embodiments the wafer temperature is maintained during the direct plasma reaction at a temperature of 200 to 800 degrees C. such as about 425 degrees C. In some embodiments, the lid heater is heated during the direct plasma reaction to a temperature of 200 to 800 degrees C. such as about 550 degrees C. In some embodiments a pedestal temperature during the direct plasma reaction is maintained at a temperature of 200 to 800 degrees C., or about 450 degrees C.

In some embodiments, the nitridation process sequence or the direct plasma reaction provides nitrogen at a flow rate of about 0.1 slpm to 6 slpm, and hydrogen in an amount of 0.1 slpm to 6 slpm. In embodiments, the pressure of the process chamber during the direct plasma reaction is maintained at 1 Torr to 15 Torr. In embodiments, RF power is applied during the direct plasma reaction at about 100 watts to 1000 watts.

Figure 5A:
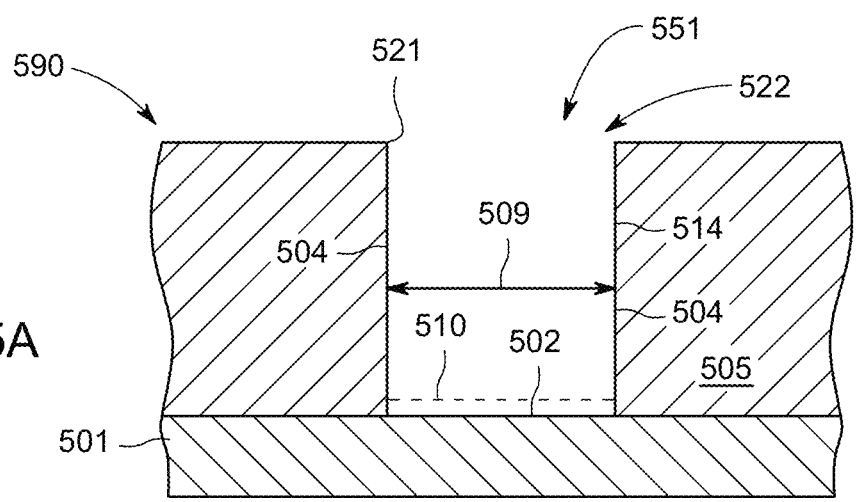
FIGS. 5A-5C are illustrative cross-sectional views of the substrate during different stages of the processing sequence of FIG. 4 in accordance with some embodiments of the present disclosure.
Figure 5B:
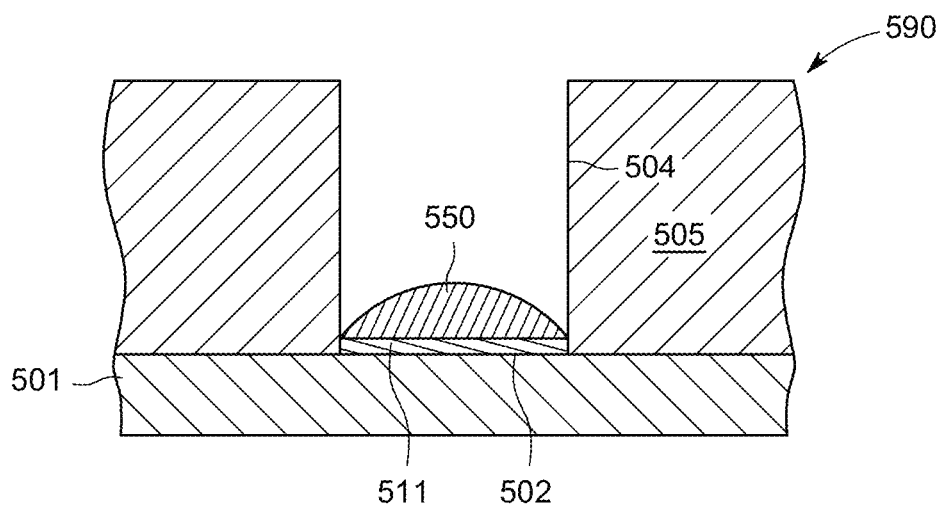
Figure 5C:
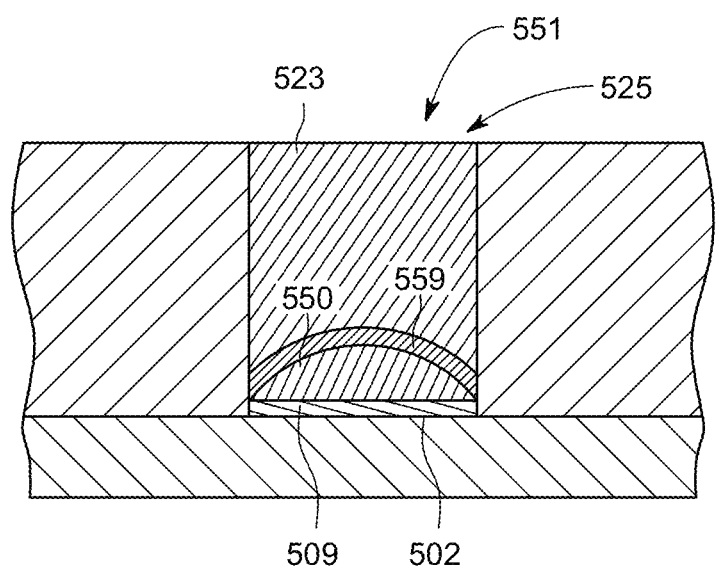

FIG. 4 is a flowchart of a method 400 of selective deposition in accordance with some embodiments of the present disclosure. FIGS. 5A-5C are illustrative cross-sectional views of the substrate during different stages of the processing sequence of FIG. 4 in accordance with some embodiments of the present disclosure. The methods of the present disclosure may be performed in process chambers configured for thermal deposition techniques such as chemical vapor deposition (CVD), or the process chamber discussed above with respect to FIG. 1.

In embodiments, the method 400 is performed on a semiconductor substrate 590, as depicted in FIG. 5A, having a silicon surface 502 and one or more dielectric surfaces such as dielectric surface 504. In embodiments, semiconductor substrate 590 may comprise a silicon material 501 such as silicon material 301 described above.

In some embodiments, silicon material 501 is deposited via any suitable atomic layer deposition process or a chemical layer deposition process. In some embodiments, the silicon material 501 may comprise any suitable silicon material for semiconductor device fabrication. Referring to FIG. 5A, a silicon oxide layer (not shown) may be atop silicon surface 502. The silicon oxide layer may be a native oxide layer 510 (shown in phantom in FIG. 5A) or form as silicon surface 502 contacts oxygen, for example in air or water. In some embodiments, silicon oxide layer may be problematic in that the silicon oxide layer may be less selective towards titanium materials than an exposed silicon surface. In some embodiments, method 400 may include, pre-treating the silicon surface 502 to form an exposed silicon surface. In some embodiments, methods include contacting the silicon surface 502 with one or more etchants to form an exposed silicon surface 502. In some embodiments, a silicon oxide layer is removed prior to depositing a titanium material atop, or directly atop silicon surface 502 to form an exposed silicon surface. Non-limiting examples of exposed silicon surface material includes substantially pure, for example, substantially free of oxide, silicon and the like. In some embodiments, the semiconductor substrate 590 may be pretreated and post-treated as described above. In some embodiments, a post-deposition treatment is optionally performed subsequent to remote plasma CVD deposition of titanium silicide as described above. In some embodiments, a post-deposition treatment is optionally performed subsequent to remote plasma CVD deposition of titanium as described above.

In embodiments, dielectric layer 505 including dielectric surface 504 is not the same as silicon material 501 including silicon surface 502. In some embodiments, the dielectric layer 505 is deposited via any suitable atomic layer deposition process or a chemical layer deposition process. In embodiments, dielectric layer 505 and dielectric surface 504 comprise or consist of silicon oxide ($SiO_2$), silicon nitride, silicon oxynitride (SiON), or combinations thereof.

In embodiments, the dielectric layer 505 may include one or more features 551 such as a via or trench formed in the dielectric layer 505. The one or more features 551 may be formed by etching the dielectric layer 505 using any suitable etch process. In some embodiments, the one or more features 551 is defined by one or more sidewalls 514, an opening 522 and upper corners 521. In some embodiments, the one or more features 551 may have a high aspect ratio, e.g., an aspect ratio between about of about 5:1 and about 20:1. As used herein, the aspect ratio is the ratio of a depth of the feature to a width of the feature. In embodiments, the one or more features 551 has a width 509 less than or equal to 20 nanometers, less than or equal to 10 nanometers, or a width 509 between 5 to 10 nanometers.

In embodiments, method 400 begins at 402 (shown in phantom) by optionally, forming a first direct plasma reaction between titanium tetrachloride ($TiCl_4$), hydrogen ($H_2$) and argon (Ar) inside a process chamber in a region between a showerhead and a substrate for a duration of 0.1 to 200 seconds. In embodiments, a layer such as monolayer of titanium material 511 (shown in FIG. 5B) may be deposited upon the silicon surface 502 to prime the silicon surface 502 for further deposition. In embodiments, the first direct plasma reaction is performed for a very short duration such as 0.1 to 200 seconds. In embodiments, the first direct plasma reaction is performed at a temperature of 200 to 800 degrees C., or 300 to 700 degrees C. In embodiments, titanium tetrachloride (TiCl$_4$), hydrogen (H$_2$) and argon (Ar) are provided to a process chamber in an amount sufficient to prime the silicon surface 502 for further deposition. In embodiments, titanium tetrachloride (TiCl$_4$), hydrogen (H$_2$) and argon (Ar) are provided to a process chamber in an amount sufficient to deposit a monolayer of titanium material 511 such as titanium upon the silicon surface 502.

In embodiments, method 400 may begin at process sequence 404 by forming a remote plasma reaction between titanium tetrachloride (TiCl$_4$), hydrogen (H$_2$) and argon (Ar) within a process chamber such as in a region between a lid heater and a showerhead to form a titanium material layer 550 (shown in FIG. 5B) upon a semiconductor substrate 590 inside a processing chamber to selectively deposit the titanium material layer 550 atop the silicon surface 502 of the semiconductor substrate 590, wherein the dielectric surface 504 inhibits deposition of the titanium material layer 550 atop the dielectric surface 504. In embodiments, the remote plasma reaction reacts titanium tetrachloride (TiCl$_4$), hydrogen (H$_2$) and argon (Ar) at a first temperature of 200 to 800 degrees C.

In some embodiments the remote plasma reaction may form a titanium silicide as titanium material layer 550. For example, in embodiments, forming a remote plasma reaction between titanium tetrachloride (TiCl$_4$), hydrogen (H$_2$) and argon (Ar) within a process chamber between a lid heater and a showerhead further comprises adding silane, hydrogen, and argon to the showerhead to contact the remote plasma reaction. In some embodiments, the silane, hydrogen, and argon may be supplied via second flow line 163 as shown in FIG. 1.

In some embodiments, the method 400 may optionally include post-treating the titanium material layer atop the substrate as shown in method 400 at process sequence 405. In embodiments, the post-treating includes embodiments, described above with respect to method 200 at process sequence 205.

In embodiments, method 400 includes at 406 (as shown in FIG. 5C) forming a direct plasma reaction between nitrogen (N$_2$), hydrogen (H$_2$) and argon (Ar) inside a process chamber in a region between the showerhead and the substrate to form a titanium nitride layer 559 upon the titanium material layer 550 atop or within the silicon surface 502 of the substrate. In some embodiments, the titanium nitride layer 559 forms within the titanium material layer 550.

In embodiments, as shown in FIG. 5C, the silicon surface 502 is at a bottom of a feature 551. In embodiments, methods of the present disclosure further comprise filling the feature from a bottom to a top 525 with metal fill 523 such as cobalt or tungsten.

In embodiments, the present disclosure relates to a processing chamber, comprising: a lid heater; a showerhead; and a substrate support positioned within the processing chamber, wherein the processing chamber is configured to remotely ignite a plasma in a region between the lid heater and the showerhead and directly ignite a plasma in a region between the showerhead and the substrate support. In some embodiments, the lid heater comprises an RF electrode for emitting RF energy into the processing chamber. In some embodiments, the showerhead comprises an RF electrode for emitting RF energy into the processing chamber. In some embodiments, the showerhead may optionally be connected to a ground. For example, depending on the user needs and desired placement of plasma in the processing chamber, the showerhead may be grounded, or ungrounded. In embodiments, the showerhead is connected to a ground to remotely ignite a plasma inside a process chamber between a lid heater and a showerhead. In some embodiments, the showerhead is not connected to a ground to directly ignite a plasma inside a process chamber between the showerhead and the substrate. In embodiments, the substrate support is connected to a ground. In some embodiments, the process chamber includes a switch 184 in communication with the ground 183 and RF electrode 180 and configured to control remote and direct plasma formation in accordance with the present disclosure and depending upon user needs. In embodiments the switch 184 and showerhead 165 are in communication and configured to control remote and direct plasma formation in accordance with the present disclosure and depending upon user needs. In some embodiments, about 65 watts to 150 watts of RF energy is applied to the remote plasma reaction within process volume 101. In some embodiments, RF energy is about 120 watts to 140 watts or 130 about watts to the remote plasma reaction within process volume 101. In some embodiments, pulsed RF energy or RF in a continuous wave mode is applied to the remote plasma reaction within process volume 101. In some embodiments, the RF power is about 130 watts, with a pulsed frequency of about 1 kHz, with duty cycle about 50% in the remote plasma reaction within process volume 101.

In some embodiments, the present disclosure relates to a method of selectively depositing a titanium material layer atop a substrate having a silicon surface and a dielectric surface, including: forming a remote plasma reaction between titanium tetrachloride (TiCl$_4$), hydrogen (H$_2$) and a noble gas such as argon (Ar) in a region between a lid heater and a showerhead of a process chamber at a first temperature of 200 to 800 degrees C. to form one or more reaction products; and flowing the one or more reaction products into the process chamber to selectively form a titanium material layer upon the silicon surface of the substrate. In some embodiments, the methods include adding one or more silane compounds, hydrogen, and a noble gas such as argon to the showerhead to contact the remote plasma reaction. In some embodiments, the one or more silane compounds include one or more of silane (SiH$_4$), disilane (Si$_2$H$_6$), trisilane (Si$_3$H$_8$), and tetrasilane (Si$_4$H$_{10}$), or combinations thereof. In embodiments, one or more silane compounds are added in an amount sufficient to form TiSix in accordance with the present disclosure.

The disclosure may be practiced using other semiconductor substrate processing systems wherein the processing parameters may be adjusted to achieve acceptable characteristics by those skilled in the art by utilizing the teachings disclosed herein without departing from the spirit of the disclosure.

While the foregoing is directed to embodiments of the present disclosure, other and further embodiments of the disclosure may be devised without departing from the basic scope thereof.

The invention claimed is:

1. A process chamber, comprising:
   a lid heater;
   a showerhead disposed beneath the lid heater; and
   a substrate support positioned within the processing chamber beneath the showerhead, wherein the process chamber is configured to remotely ignite a plasma in a region between the lid heater and the showerhead and to directly ignite a plasma between the showerhead and the substrate support.

2. The process chamber of claim 1, wherein the showerhead is connected to a ground to remotely ignite a plasma inside a process chamber between a lid heater and a showerhead.

3. The process chamber of claim 1, further comprising: gas panel coupled to the process chamber and configured to supply titanium tetrachloride ($TiCl_4$), hydrogen ($H_2$), and a noble gas.

4. The process chamber of claim 3, wherein the gas panel is further configured to supply silane and disilane.

5. The process chamber of claim 1, wherein the lid heater is configured to heat the region between the lid heater and the showerhead to a temperature of 200 to 800 degrees C.

6. The process chamber of claim 1, further comprising a radio frequency electrode embedded in the lid heater and a radio frequency electrode embedded in the showerhead.

7. The process chamber of claim 1, further comprising a switch in communication with ground and RF electrode and showerhead and configured to selectively couple RF energy to the chamber lid when the switch is disposed in a first position and to selectively couple RF energy to the showerhead when the switch is disposed in a second position.

8. The process chamber of claim 1, further comprising a heating element embedded in the substrate support.

9. The process chamber of claim 1, wherein the showerhead is a multiple gas showerhead having two or more separate pathways which allow two or more gases to be separately introduced into the process chamber without premixing.

10. The process chamber of claim 9, further comprising a first gas flow line configured to provide gas flow to the region between the lid heater and showerhead and a second gas flow line configured to provide gas flow within the showerhead.

11. The process chamber of claim 1, further comprising:
a control unit configured to control operation of the process chamber to selectively deposit a titanium material layer atop a substrate having a silicon surface and a dielectric surface by:
forming a remote plasma reaction between titanium tetrachloride ($TiCl_4$), hydrogen ($H_2$) and argon (Ar) in a region between a lid heater and a showerhead of a process chamber at a first temperature of 200 to 800 degrees C.; and
flowing reaction products into the process chamber to selectively form a titanium material layer upon the silicon surface of the substrate.

12. The process chamber of claim 11, wherein the control unit is further configured to control operation of the process chamber by, prior to selectively forming a titanium material layer upon the silicon surface of the substrate, preheating the substrate to a temperature of 200 to 800 degrees C. and contacting the substrate and dielectric surface with argon, hydrogen, silane, and combinations thereof.

13. A process chamber, comprising:
a lid heater;
a showerhead disposed beneath the lid heater, wherein the showerhead is a multiple gas showerhead having two or more separate pathways which allow two or more gases to be separately introduced into the process chamber without premixing;
a plenum defined in a region between the lid heater and the showerhead;
a gas panel configured to provide one or more gases to the plenum via a first gas line and to provide one or more gases within the showerhead via a second gas line; and
a substrate support positioned within the processing chamber beneath the showerhead, wherein the process chamber is configured to remotely ignite a plasma in the plenum and to directly ignite a plasma between the showerhead and the substrate support.

14. The process chamber of claim 13, wherein the showerhead is connected to a ground to remotely ignite a plasma inside a process chamber between a lid heater and a showerhead.

15. The process chamber of claim 13, wherein the gas panel is configured to supply titanium tetrachloride ($TiCl_4$), hydrogen ($H_2$), and a noble gas.

16. The process chamber of claim 15, wherein the gas panel is further configured to supply silane and disilane.

17. The process chamber of claim 13, wherein the lid heater is configured to heat the region between the lid heater and the showerhead to a temperature of 200 to 800 degrees C.

18. The process chamber of claim 13, further comprising a radio frequency electrode embedded in the lid heater and a radio frequency electrode embedded in the showerhead.

19. The process chamber of claim 13, further comprising a switch in communication with ground and RF electrode and showerhead and configured to selectively couple RF energy to the chamber lid when the switch is disposed in a first position and to selectively couple RF energy to the showerhead when the switch is disposed in a second position.

20. The process chamber of claim 13, further comprising a heating element embedded in the substrate support.

* * * * *